(12) United States Patent
Durham et al.

(10) Patent No.: US 6,253,350 B1
(45) Date of Patent: Jun. 26, 2001

(54) METHOD AND SYSTEM FOR DETECTING ERRORS WITHIN COMPLEMENTARY LOGIC CIRCUITS

(75) Inventors: Christopher McCall Durham; Peter Juergen Klim; Ronald Gene Walther, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/162,467

(22) Filed: Jul. 9, 1998

(51) Int. Cl.[7] .......................................................... H04L 1/08
(52) U.S. Cl. ............................ 714/823; 326/121; 326/129
(58) Field of Search ............................... 326/31, 113, 121, 326/129, 122; 340/162.2; 327/211; 714/816, 823

(56) References Cited

U.S. PATENT DOCUMENTS

| | | | |
|---|---|---|---|
| 4,694,274 | * 9/1987 | Shimada | 340/146.2 |
| 5,450,020 | * 9/1995 | Jones et al. | 326/31 |
| 5,633,820 | * 5/1997 | Beakes et al. | 364/787 |
| 5,777,491 | * 6/1998 | Hwang et al. | 326/113 |
| 6,043,696 | * 3/2000 | Klass et al. | 327/211 |
| 6,046,608 | * 4/2000 | Theogarajan | 326/121 |

* cited by examiner

Primary Examiner—Albert Decady
Assistant Examiner—Guy Lamarre
(74) Attorney, Agent, or Firm—Casimer K. Salys; Bracewell & Patterson, L.L.P.

(57) ABSTRACT

A method and system for detecting faults within dual-rail complementary logic circuits. A method and system are disclosed for detecting faults within dual-rail complementary logic circuits. A dual-rail complementary logic circuit is coupled to an associated complementary fault detection circuit within an integrated circuit. Thereafter, the presence of a non-complementary logic signal can be detected at an output of the complementary fault detection circuit, in response to providing an input signal at an input of the dual-rail complementary logic circuit, such that the presence of a non-complementary logic signal at an output of the complementary fault detection circuit indicates the presence of a fault within the associated complementary logic circuit.

12 Claims, 4 Drawing Sheets

METHOD AND SYSTEM FOR DETECTING ERRORS WITHIN COMPLEMENTARY LOGIC CIRCUITS

BACKGROUND OF THE INVENTION

1. Technical Field

The present invention generally relates to integrated circuit technology. In particular, the present invention relates to methods and systems for detecting manufacturing defects and logical errors within integrated circuits. More particularly the present invention relates to methods and systems for detecting manufacturing defects and logical errors within complementary circuits.

2. Description of the Related Art

As processor speeds continue to climb, designers are forced to achieve higher circuit speeds in order to accommodate the increased demand in processor performance. Many circuit design techniques are presently being utilized to achieve such high speeds. For example, dynamic logic is increasingly being utilized in integrated circuit designs to increase processor speed. Dynamic logic, however, while suitable for increasing the speed of integrated circuits, is error prone and costly to debug when failing. Consequently, fast static logic families are becoming more prevalent in industry today to counteract the issues involved with dynamic logic. Such static logic families are typically dual-rail in nature, meaning that they produce true and complementary output signals in parallel. Examples of such families include Double Pass-Transistor Logic (DPL), Differential Cascode Voltage Switch with Pass-Gate (DCVSPG), and Complementary Pass-Transistor Logic (CPL).

However testing problems involved with complementary logic circuits quickly arise when implementing such circuits as integrated circuit chips. For example, nodes may become "stuck," "open," or shorted to other signals due to manufacturing errors, causing output signals of the wrong value or state. Such incorrect values can cause problems in subsequently connected logic stages, leading to a significant reduction in testing coverage. Any subsequently connected logic stages coupled "downstream" in an integrated circuit cannot expect such defective complementary logic circuits to supply the correct complementary logic signals, thus causing floating nodes or value contention (i.e., indeterminate state) within the complementary logic circuits. Such indeterminate results can lead to a failure to expose a defective circuit during testing, resulting in later logic errors during circuit use.

Presently, techniques do not exist for specifically identifying errors within complementary logic circuits. Based on the foregoing, those skilled in the art will appreciate that a need exists for a method and system which would allow designers to implement on-chip testing circuits which specifically indicate that associated complementary circuits contain manufacturing defects or logical errors.

SUMMARY OF THE INVENTION

It is therefore an object of the present invention to provide for an improved integrated-circuit technology.

It is another object of the present invention to provide an improved method and system for detecting manufacturing defects and logical errors within integrated circuits.

It is still another object of the present invention to provide a method and system for detecting manufacturing defects and logical errors within complementary circuits.

It is yet another object of the present invention to provide for a method and system for detecting manufacturing defects and logical errors within complementary circuits utilizing a complementary fault detection circuit in association with a complementary circuit.

The above and other objects are achieved as is now described. A method and system are disclosed for detecting faults within complementary logic circuits. A complementary logic circuit is coupled to an associated complementary fault detection circuit within an integrated circuit. Thereafter, the presence of a non-complementary logic signal can be detected at an output of the complementary fault detection circuit, in response to providing an input signal at an input of the complementary logic circuit, such that the presence of a non-complementary logic signal at an output of the complementary fault detection circuit indicates the presence of a fault within the associated complementary logic circuit.

BRIEF DESCRIPTION OF THE DRAWINGS

The novel features believed characteristic of the invention are set forth below. The invention itself, however, as well as a preferred mode of use, further objects and advantages thereof, will best be understood by reference to the following detailed description of an illustrative embodiment when read in conjunction with the accompanying drawings, wherein.

DETAILED DESCRIPTION OF PREFERRED EMBODIMENT

Figure 1:
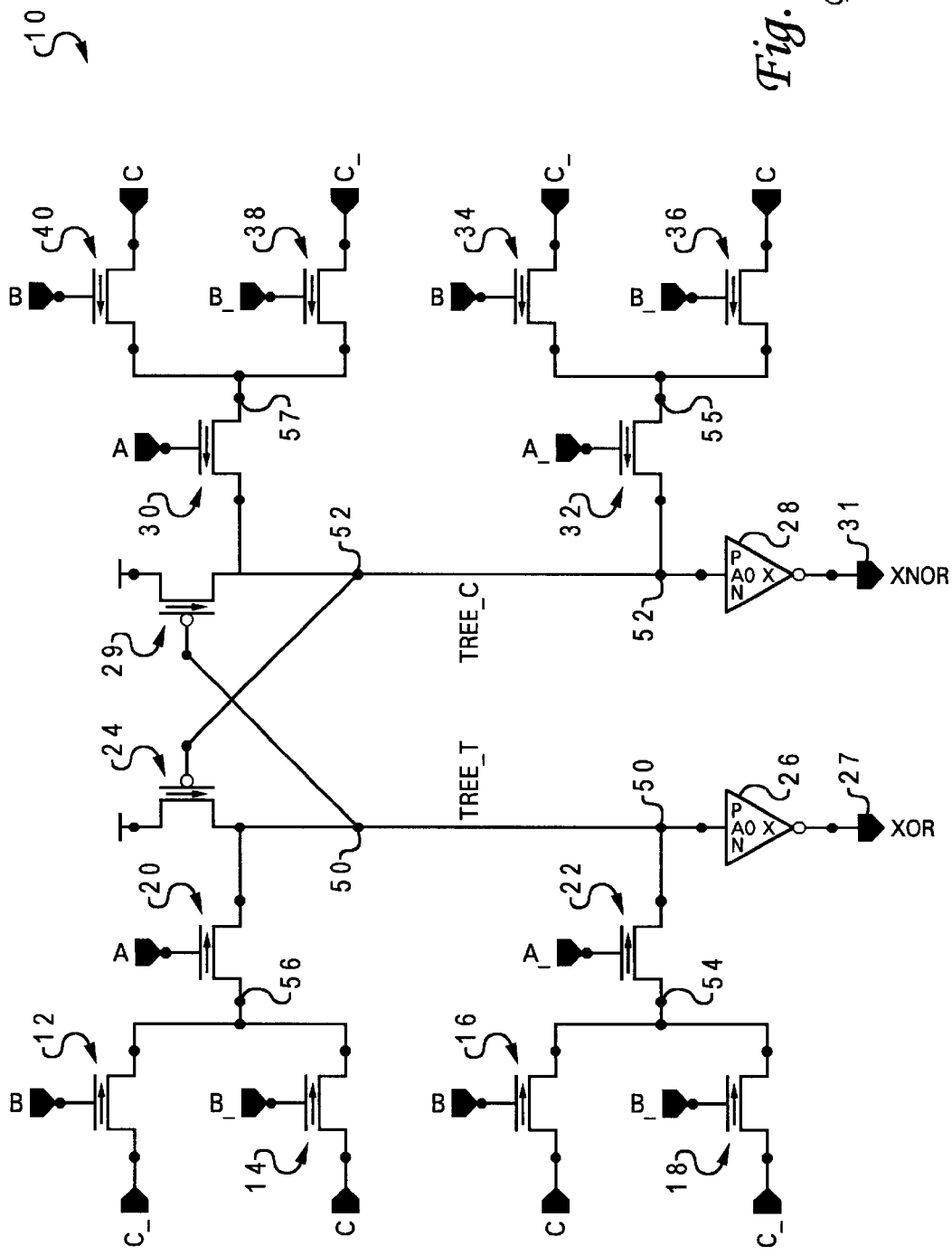
FIG. 1 is a schematic diagram of a prior art complementary pass-transistor circuit.

With reference now to the figures and in particular with reference to FIG. 1, a schematic diagram of a prior art complementary pass-transistor logic circuit 10 is depicted. Complementary pass-transistor logic circuit 10 includes an inverter 26 and an inverter 28. Inverter 26 supplies a XOR output signal 27. Inverter 28 supplies a XNOR output signal 31. The input of inverter 26 is connected to the source of transistor 20, the source of transistor 22, the source of transistor 24, and the gate of transistor 29 at node 50. The input of inverter 28 is connected to the source of transistor 29, the source of transistor 32, the source of transistor 30 and the gate of transistor 24 at node 52. Thus, node 50 is cross-coupled to the gate of transistor 29, and node 52 is cross-coupled to the gate of transistor 24.

The drain of transistor 22 is coupled to the source of transistor 16 and the source of transistor 18 at node 54. An "A_" signal is input to the gate of transistor 22. A "B_" signal is input to the gate of transistor 18, and a "B" signal is input to the gate of transistor 16. A "C_" signal is input to the drain of transistor 18, and a "C" signal is input to the drain of transistor 16.

The drain of transistor 20 is coupled to the source of transistor 12 and the source of transistor 14 at node 56. An "A" signal is input to the gate of transistor 20. A "B_" signal is input to the gate of transistor 14, and a "B" signal is input to the gate of transistor 12. A "C" signal is input to the drain of transistor 14, and a "C_" signal is input to the drain of transistor 12.

Transistors 24 and 29 each include a drain coupled to a voltage power supply ($V_{dd}$). Transistor 30 includes a gate coupled to an "A" input signal and a drain connected to the respective sources of transistors 38 and 40 at node 57. A "B_" input signal is connected to the gate of transistor 38, while a "B" input signal is coupled to the gate of transistor 40. Transistor 38 also includes a drain connected to a "C_" input signal. A "C" input signal is fed to the drain of transistor 40.

The gate of transistor 32 is connected to an "A_" input signal, while the drain of transistor 32 is respectively coupled to the sources of transistors 34 and 36 at node 55. The gate of Transistor 34 is coupled to a "B" input signal while the drain of transistor 34 is connected to a "C_" input signal. The gate of transistor 36 is coupled to a "B_" input signal, while the drain of transistor 36 is connected to a "C" input signal. Node 50 is also referred to in FIG. 1 as node "TREE_T". Node 52 is referred to in FIG. 1 as "TREE_C".

Based on the foregoing, complementary pass-transistor logic circuit 10 is composed of a three-way XOR/XNOR circuit, which performs the following logic functions:

XOR=(A)(B)(C)+(A)(B_)(C_)+(A_)(B)(C_)+(A_)(B_)(C)

XNOR=(A)(B)(C_)+(A)(B_)(C)+(A_)(B)(C)+(A_)(B_)(C_)

Complementary pass-transistor logic circuit 10 operates differentially. When the input signals force one output high, an associated complementary output is forced low. At internal node TREE_T and TREE_C, located immediately before the output inverters 26 and 28, the cross-coupled PMOS devices (i.e., transistors 24 and 29) act to aid the opposite output signal. For example, when A=1, B=1 and C_=0, NMOS transistors 20 and 12 are placed in an "on" state, pulling TREE_T low.

Similarly, on the other side of the circuit, A=1 and B=1 turn on NMOS transistors 40 and 30, connecting signal "C" (which is equivalent to 1, because C_=0) to node TREE_C, thereby pulling node TREE_C to one NMOS device threshold below the supply voltage ($V_{dd}-V_{tn}$). However, node TREE_T being low turns on pmos transistor 29, which helps to pull up node TREE_C, in addition to the force from signal C. Oppositely, node TREE_C being at "$V_{dd}-V_{tn}$" reduces the current through PMOS transistor 24, allowing C_ to pull node TREE_T low quicker. This differential operation speeds up the circuit significantly.

Test problems with complementary pass-transistor logic circuits, such as complementary pass-transistor logic circuit 10 of FIG. 1, quickly arise. For example, if the node labelled "TREE_T" in FIG. 1 is forced to remain at a high state due to a manufacturing error, output "XOR" will always be low. If, then, node "TREE_C" is functioning normally, then output "XNOR" will function at a proper logic state. However, the normally logically complementary outputs ("XOR" and "XNOR") will no longer provide opposite states, which can cause indeterminate logic states in later logic stages, leading to a significant reduction of test coverage. Logic "downstream" cannot thus guarantee that its inputs will be complementary, which may in fact produce indeterminate results due to the presence of floating nodes or value contention. This in turn can lead to a failure to expose a defective circuit during a testing phase, resulting later in logic errors during circuit use.

Thus, the invention presented herein centers on detecting when the outputs of complementary circuits are not logically complementary. That is, if it is possible to determine when a complementary circuit or group of circuits has produced a faulty result due to the presence of non-complementary outputs, then the focus of the problem examination can be narrowed to that particular complementary circuit or associated group of circuits. Such a non-complementary output determination can be accomplished utilizing the complementary fault detection circuit depicted in FIG. 2 in association with the complementary pass-transistor logic circuit illustrated in FIG. 3. The overall system presented and discussed herein, if physically implemented as a preferred embodiment of the present invention, can thus detect when a fault occurs that causes non-complementary output signals.

Figure 2:
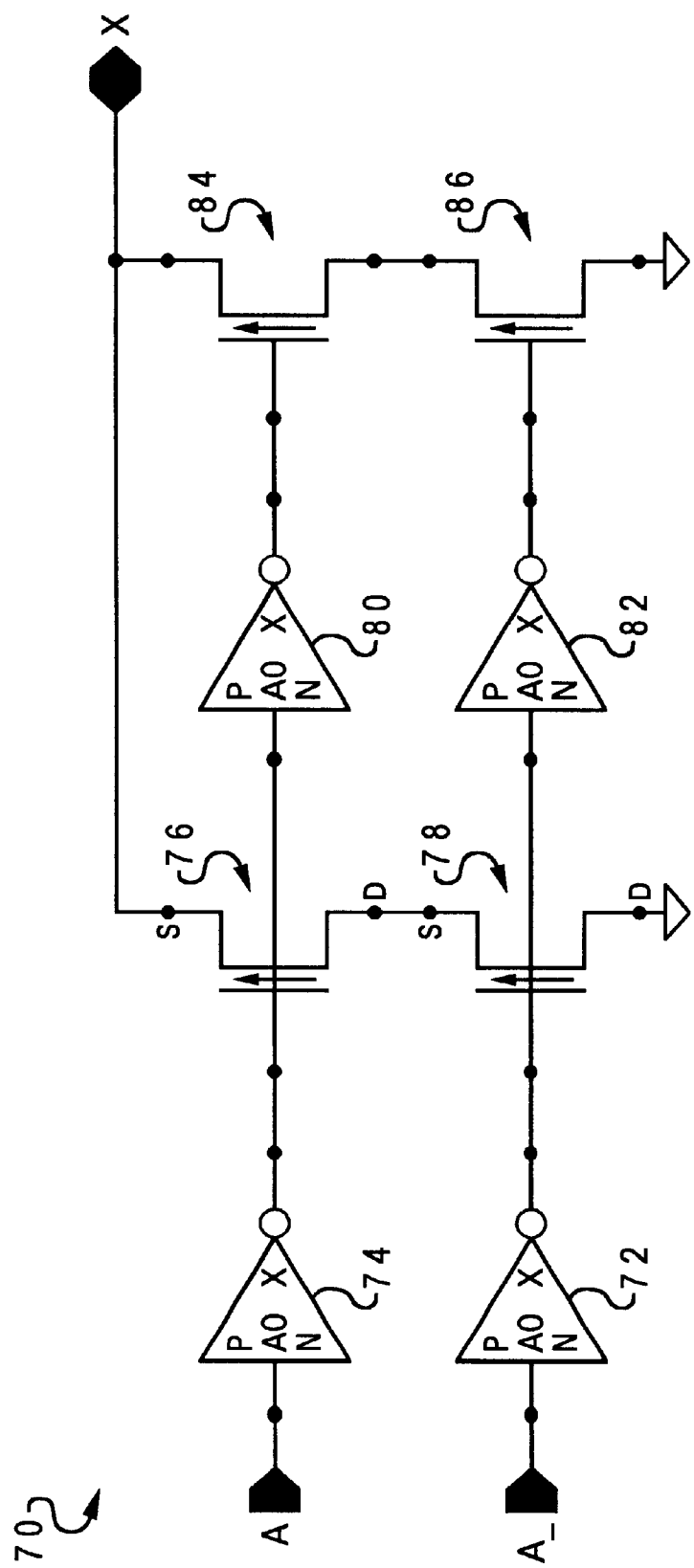
FIG. 2 is a schematic diagram of complementary fault detection circuit, which can be utilized in accordance with a preferred embodiment of the present invention.

FIG. 2 is a schematic diagram of complementary fault detection circuit 70, which can be utilized in accordance with a preferred embodiment of the present invention. Although other designs are possible, a preferred embodiment of the present invention, implemented as a complementary fault detection circuit, includes four inverters and a two-way parallel pair of two-high stacked NMOS devices. In FIG. 2, inverter 74 receives as input, an "A" signal. The output of inverter 74 is fed to the input of inverter 80 and to the gate of transistor 76. The source of transistor 76 is coupled to node X, while the drain of transistor 76 is connected to the source of transistor 78. The drain of transistor 78 is coupled to ground. The gate of transistor 78 is coupled to the output of inverter 72, which receives as input, an "A_" input signal. The output of inverter 72 is also coupled to the input of inverter 82.

The output of inverter 82 is connected to the gate of transistor 86 whose drain is coupled to ground and whose source is connected to the drain of transistor 84. The source of transistor 84 is also connected to node X. The gate of transistor 84 is coupled to the output of inverter 80. The four inverters are configured as inverters 72, 74, 80, and 82 in FIG. 2. The first pair of inverters 72 and 74 are utilized to buffer complementary input signals "A" and "A_", and drive one set of two-high stacked NMOS devices (e.g., transistors 76 and 78). The outputs of inverters 72 and 74 are fed through two inverters (i.e. inverters 80 and 82) that also drive a pair of two-high stacked NMOS device gates via transistors 84 and 86. The two NMOS device stacks are connected to ground on one side and are wired together on the other side to produce node X.

Thus, when input signals "A" and "A_" are both high or both low, indicating a faulty complementary condition, node X will be connected to ground. Note that the NMOS devices located after each set of inverters do not load down the dual-rail circuit outputs (i.e., signals "A" and "A_"), because such outputs are isolated by the inverters themselves. Complementary fault detection circuit 70 is sized with minimum size devices via inverters 80, 82 and 72, 74 to reduce loading effects on any connected complementary circuits and to minimize circuit power consumption.

Figure 3:
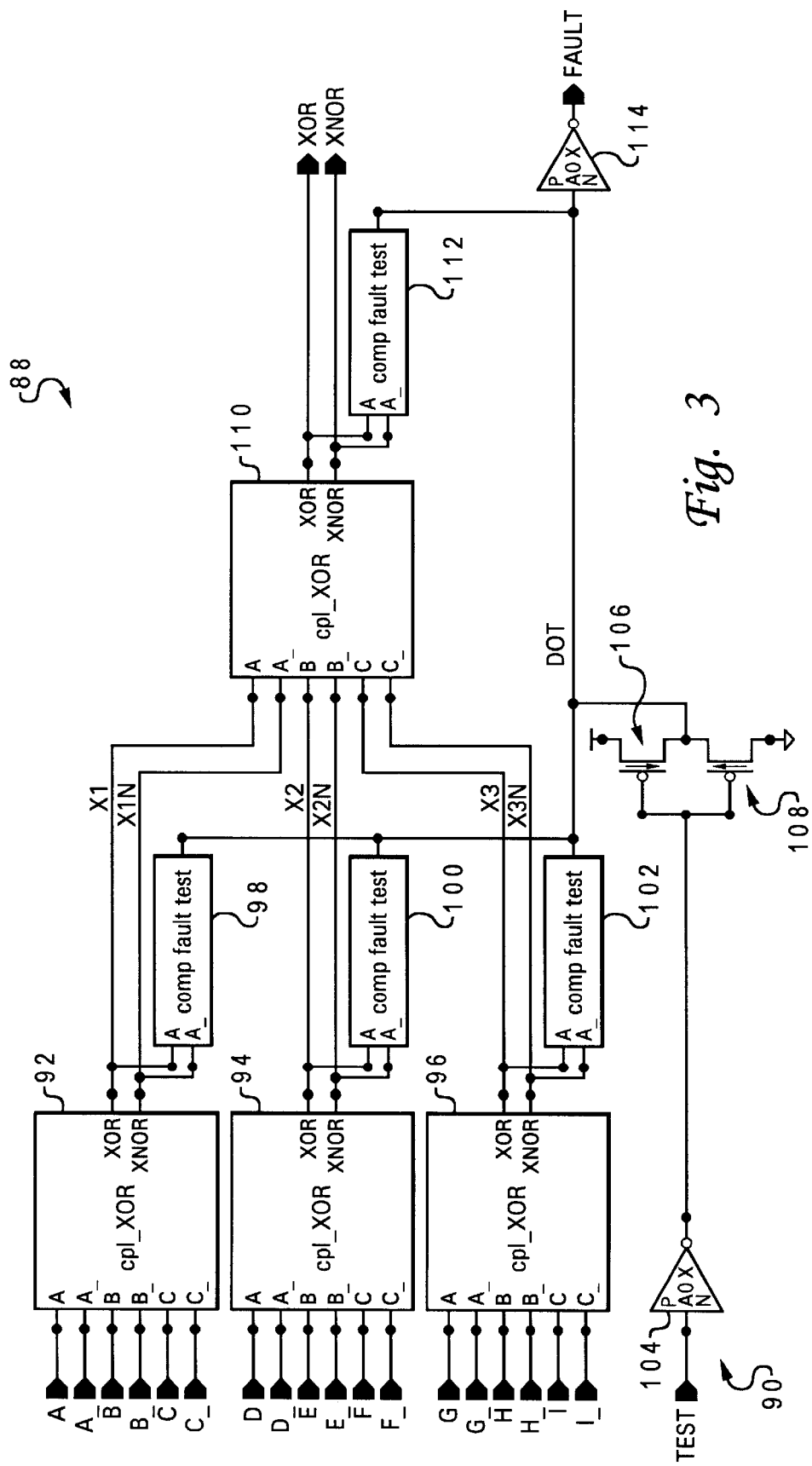
FIG. 3 is a schematic diagram of a complementary fault detection circuit connected to the output of each complementary circuit, in accordance with a preferred embodiment of the present invention.

FIG. 3 is a schematic diagram 88 of a complementary fault detection circuit 90 connected to the output of each complementary circuit, in accordance with a preferred embodiment of the present invention. Complementary fault detection circuit 90 utilizes a dual-rail input configuration, such as complementary fault detection circuit 70 of FIG. 2, connected to the output of each complementary circuit. Each complementary fault detection circuit can comprise a dual-rail test circuit. All of the complementary fault detection circuit outputs are coupled together in a "dotted" fashion at node DOT. Thus, four complementary fault detection circuits, analogous to complementary fault detection circuit 70 of FIG. 2, are depicted in FIG. 3 as complementary fault detection circuit 98, complementary fault detection circuit 100, complementary fault detection circuit 102, and complementary fault detection circuit 112. Each of these circuits have an output node X coupled to the DOT node.

Each complementary fault detection circuit is associated with a complementary circuit. Complementary fault detection circuit 98 is associated with complementary circuit 92. Complementary fault detection circuit 100 is associated with complementary circuit 94. Complementary fault detection circuit 102 is associated with complementary circuit 96, and complementary fault detection circuit 112 is associated with complementary circuit 110. Complementary circuit 92 includes six input nodes (A, A_, B, B_, C, C_) and an XOR and XNOR output. Each input node of complementary circuit 92 is respectively coupled to an input signal ("A", "A_", "B", "B_", "C", "C_") The XOR output of complementary circuit 92 is connected to an "A" input of associated complementary fault detection circuit 98 and is further coupled to an "A" input of complementary circuit 110 via line Xl. The XNOR output of complementary circuit 92 is connected to the "A_" input of associated complementary fault detection circuit 98 and is further connected to the "A_" input of complementary circuit 110 via line X1N. circuit 94 includes six input nodes (A, A_, B, B_, C, C_) and an XOR and XNOR output. Each input node of complementary circuit 94 is respectively coupled to an input signal ("D", "D_", "E", "E_", "F", "F_"). The XOR output of complementary circuit 94 is connected to an A input of associated complementary fault detection circuit 100, and is further coupled to a "B" input of complementary circuit 110 via line X2. The XNOR output of complementary circuit 94 is coupled to the "A_" input of associated complementary fault detection circuit 100 and to the "B_" input of complementary circuit 110 via an X2N line.

Complementary circuit 96 includes six input nodes (A, A_, B, B_, C, C_) and an XOR and XNOR output. Each input node of complementary circuit 96 is respectively coupled to an input signal ("G", "G_", "H", "H_", "I", "I_"). The XOR output of complementary circuit 96 is coupled to the "A" input of associated complementary fault detection circuit 102 and to the "C" input of complementary circuit 110 via line X3. The XNOR output of complementary circuit 96 is connected to the "A_" input of complementary fault detection circuit 102 and to the "C_" input of complementary circuit 110 via line X3N. Complementary circuit 110, a complementary circuit, analogous to complementary circuits 92, 94, and 96, includes an XOR output and XNOR output. The XOR output of complementary circuit 110 is connected to the "A" input of an associated complementary fault detection circuit 112, while the XNOR output of complementary circuit 110 is coupled to the "A_" input of complementary fault detection circuit 112.

A test control signal TEST is brought in through inverter 104 whose output drives the gate of a weak PMOS device (i.e., transistor 106), and the gate of an NMOS device (i.e., transistor 108). Transistor 106 includes a source connected to power supply $V_{dd}$ and a drain coupled to the drain of an NMOS device (i.e., transistor 108), whose source is connected to ground. The drain of transistor 106 and the drain of transistor 108 are coupled to one another and to the DOT common node. The signal DOT is coupled to the input of inverter 114 to produce a FAULT signal output. The weak PMOS device (i.e., transistor 106) is sized such that any of the NMOS stacks in the complementary fault detection circuits can pull node X low.

During testing, signal TEST is pulled high, which forces the output of inverter 104 low. This action turns on the weak PMOS device (i.e., transistor 106), and turns off NMOS device 108. If any of the complementary circuits (i.e., complementary circuits 92, 94, 96, or 110) connected to the dotted line (i.e., DOT) via an associated complementary fault detection circuit produces a non-complementary output, the node DOT will fall, causing inverter 114 to drive the FAULT output high. This signifies that a fault (i.e, non-complementary outputs) has occurred on at least one of the DOT nodes connected to the complementary circuits via an associated complementary fault detection circuit. Such a testing operation burns DC power only when one of the complementary circuits (i.e., complementary circuits 92, 94, 96 or 110) is faulty. That is, when an NMOS device stack within a complementary fault detection circuit pulls DOT low, the weak PMOS device (i.e., transistor 106) remains in an "on" state, which signifies that a current path from the voltage supply to ground exists.

When transistor 106 is in an "on" state and an NMOS stack within a complementary fault detection circuit is conducting, node DOT will not remain at a solid "0" voltage. Due to resistive division, the DOT node will function as some voltage in a voltage range between the supply voltage and ground. In order for the FAULT signal to provide a proper function, inverter 114 must be designed such that its resulting output value is a logical "1". Such an inverter design can be accomplished accordingly by an appropriate ratio of NMOS and PMOS devices that compose inverter 114. Such a design is simple to construct if the weak PMOS device (i.e., transistor 106) is much smaller in strength than the resulting equivalent strength of the stacked transistor pairs within each complementary fault detection circuit (e.g., the transistors 76/78 or transistors 84/86 stacked pairs of FIG. 2).

Under normal operating conditions, the TEST signal can be held low (if desired), indicating that testing of the complementary outputs (XOR and XNOR) is not desired. Under these conditions, the output of inverter 104 is high, which turns on the NMOS device (i.e., transistor 108) and turns off the weak PMOS device (i.e., transistor 106), which in turn forces the DOT signal low, resulting always in making node FAULT high. Under such conditions, the circuit does not burn any DC current. If any complementary output fault does occur, it will not be detected. If fault detection is desired during normal operations, the TEST signal is simply held high.

Figure 4:
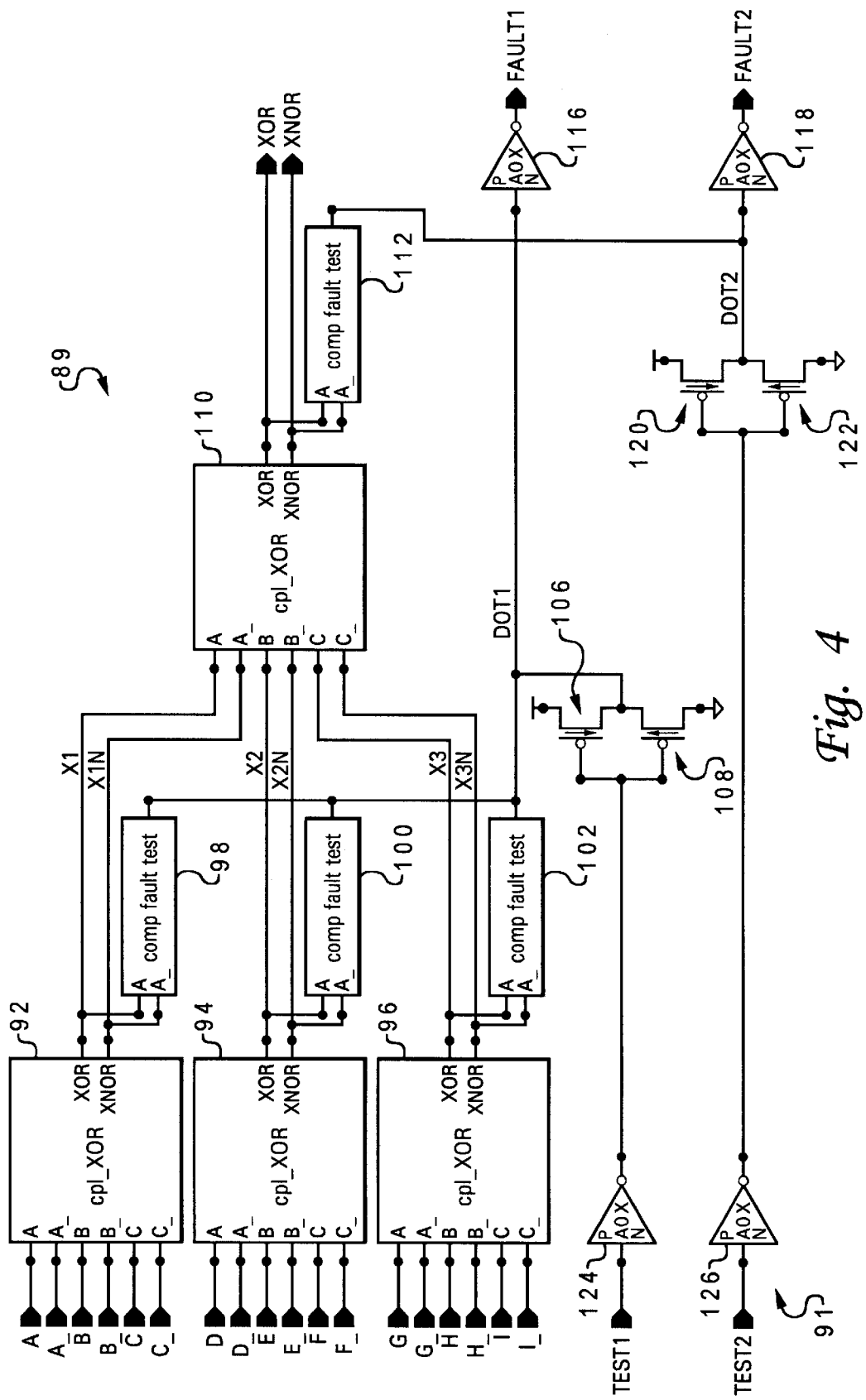
FIG. 4 is a schematic diagram illustrative of an alternative complementary fault detection system, in accordance with an alternative preferred embodiment of the present invention.

Based on the foregoing, those skilled in the art will appreciate that alternative preferred embodiments of the structure depicted in FIG. 3 can be implemented to produce any number of fault test points across the complementary logic circuits utilized in a given chip design. FIG. 4, for example, illustrates a schematic diagram 89 illustrative of a complementary fault detection system 91, in accordance with an alternative preferred embodiment of the present invention. In FIG. 3 and FIG. 4, like parts are indicated by like reference numerals. In FIG. 4, as opposed to FIG. 3, two separate test signals (i.e., TEST1 and TEST2) are utilized on two distinct sets of complementary fault detection circuits to produce separate fault signals (i.e, FAULT1 and FAULT2).

Thus, a TEST1 input is supplied to inverter 124 whose output is fed to the gates of transistors 106 and 108. Output from the source of transistor 106 and the drain of 108 is coupled to node DOT1. Node DOT1 is connected to the input of inverter 116 having a FAULT1 output signal. Input signal TEST2 is coupled to inverter 126. Output from inverter 126 is connected to the gates of transistors 120 and 122, which function analogously to transistors 106 and 108 respectively. The drain of transistor 120 is coupled to a power supply ($V_{dd}$), and the source of transistor 122 is connected to ground. The drain of transistor 122 is tied to the source of transistor 120 at node DOT2. Node DOT2 is fed to the input of inverter 118 which subsequently supplies a FAULT2 output. Output from complementary fault detection circuit 112 is also tied to node DOT2 and the input of inverter 118.

An upper limit provides a separate test control and fault signal for each complementary circuit, while a lower limit provides a single test control and fault signal (i.e., as depicted in FIG. 3). The overhead required by the fault detection systems indicated in FIG. 3 and FIG. 4 is quite small. The devices are sized at a minimum and the number of additional test signals can be as low as one. However, in any implementation and any complementary circuit family, any fault or subset of faults can be detected via complementary fault detection test logic that could not normally be achieved otherwise.

While the invention has been particularly shown and described with reference to a preferred embodiment, it will be understood by those skilled in the art that various changes in form and detail may be made therein without departing from the spirit and scope of the invention. For example, although the fault detection examples depicted herein are implemented for complementary pass-transistor logic, such fault detection systems may also apply to any complementary family (e.g., DPL, DCVSPG, etc.) of static or dynamic logic circuits. A variety of complementary family circuits may be implemented in accordance with a preferred embodiment of the present invention. For example, the complementary circuits labelled "cpl_xor" in FIG. 3 and FIG. 4 can be replaced with any dual-rail complementary circuit of any family of static or dynamic logic circuits.

Thus, The embodiments and examples set forth herein are presented in order to best explain the present invention and its practical application and to thereby enable those skilled in the art to make and use the invention. Those skilled in the art will recognize, however, that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A method for detecting faults within dual-rail complementary logic circuits, said method comprising the steps of:
   coupling the outputs of a dual-rail complementary logic circuit to an associated complementary fault detection circuit within an integrated circuit said associated complementary fault detection circuit comprising;
      a first inverter having an output connected to a gate of a first transistor and an input of a third inverter, wherein said first transistor includes a source coupled to an output of said complementary logic circuit;
      a second inverter having an output coupled to a gate of a second transistor and an input of a fourth inverter, wherein said second transistor includes a drain coupled to ground and a source coupled to a drain of said first transistor;
      said third inverter having an output connected to a gate of a third transistor, wherein said third transistor includes a source coupled to said output of said complementary logic circuit;
      said fourth inverter having an output coupled to a gate of a fourth transistor, wherein said fourth transistor includes a drain coupled to ground and a source coupled to a drain of said third transistor; and
   detecting the presence of a non-complementary logic signal at an output of said associated complementary fault detection circuit, in response to providing an input signal at an input of said dual-rail complementary logic circuit, such that the presence of a non-complementary logic signal at an output of said associated complementary fault detection circuit indicates the presence of a fault within said associated dual-rail complementary logic circuit.

2. The method of claim 1 further comprising the step of configuring said dual-rail complementary logic circuit and said associated complementary fault detection circuit within a single integrated circuit chip.

3. The method of claim 2 wherein the step of coupling the outputs of a dual-rail complementary logic circuit to an associated complementary fault detection circuit within an integrated circuit, further comprises the step of:
   coupling the outputs of a dual-rail complementary logic circuit to an associated complementary fault detection circuit within an integrated circuit, wherein said complementary logic circuit comprises a dynamic logic circuit.

4. The method of claim 2 wherein the step of coupling the outputs of a dual-rail complementary logic circuit to an associated complementary fault detection circuit within an integrated circuit, further comprises the step of:
   coupling the outputs of a dual-rail complementary logic circuit to an associated complementary fault detection circuit within an integrated circuit, wherein said complementary logic circuit comprises a complementary pass-transistor logic circuit.

5. The method of claim 2 wherein the step of coupling the outputs of a dual-rail complementary logic circuit to an associated complementary fault detection circuit within an integrated circuit, further comprises the step of:
   coupling the outputs of a dual-rail complementary logic circuit to an associated complementary fault detection circuit within an integrated circuit, wherein said complementary logic circuit comprises a double pass-transistor logic circuit.

6. The method of claim 2 wherein the step of coupling the outputs of a dual-rail complementary logic circuit to an associated complementary fault detection circuit within an integrated circuit, further comprises the step of:
   coupling the outputs of a dual-rail complementary logic circuit to an associated complementary fault detection circuit within an integrated circuit, wherein said complementary logic circuit comprises a differential cascode voltage switch with pass-gate circuit.

7. A system for detecting faults within dual-rail complementary logic circuits, said system comprising:
   means for coupling the outputs of a dual-rail complementary logic circuit to an associated complementary fault detection circuit within an integrated circuit, said associated complementary default detection circuit comprising:
      a first inverter having an output connected to a gate of a first transistor and an input of a third inverter, wherein said first transistor includes a source coupled to an output of said complementary logic circuit;
      a second inverter having an output coupled to a gate of a second transistor and an input of a fourth inverter, wherein said second transistor includes a drain coupled to ground and a source coupled to a drain of said first transistor;

said third inverter having an output connected to a gate of a third transistor, wherein said third transistor includes a source coupled to said output of said complementary logic circuit;

said fourth inverter having an output coupled to a gate of a fourth transistor, wherein said fourth transistor includes a drain coupled to ground and a source coupled to a drain of said third transistor; and means for detecting the presence of a non-complementary logic signal at an output of said associated complementary fault detection circuit, in response to providing an input signal at an input of said dual-rail complementary logic circuit, such that the presence of a non-complementary logic signal at an output of said associated complementary fault detection circuit potentially indicates the presence of a fault within said associated dual-rail complementary logic circuit.

8. The system of claim 7 further comprising:

means for configuring said dual-rail complementary logic circuit and said associated complementary fault detection circuit within a single integrated circuit chip.

9. The system of claim 8 wherein said dual-rail complementary logic circuit comprises a dynamic logic circuit.

10. The system of claim 8 wherein said dual-rail complementary logic circuit comprises a dual-rail complementary pass-transistor logic circuit.

11. The system of claim 8 wherein said dual-rail complementary logic circuit comprises a double pass-transistor logic circuit.

12. The system of claim 8 wherein said dual-rail complementary logic circuit comprises a differential cascode voltage switch with pass-gate circuit.

* * * * *

UNITED STATES PATENT AND TRADEMARK OFFICE
CERTIFICATE OF CORRECTION

PATENT NO. : 6,253,350 B1
DATED : June 26, 2001
INVENTOR(S) : Durham et al.

It is certified that error appears in the above-identified patent and that said Letters Patent is hereby corrected as shown below:

Column 5,
Line 26, please begin new paragraph and add the word -- Complementary -- before the word "circuit";

Column 6,
Line 22, please add the word -- the -- after the word "conducting,"

Signed and Sealed this

Thirtieth Day of July, 2002

*Attest:*

*Attesting Officer*

JAMES E. ROGAN
*Director of the United States Patent and Trademark Office*